(12) United States Patent
Hshieh

(10) Patent No.: US 7,812,409 B2
(45) Date of Patent: Oct. 12, 2010

(54) TRENCH MOSFET WITH CELL LAYOUT, RUGGEDNESS, TRUNCATED CORNERS

(75) Inventor: Fwu-Iuan Hshieh, Saratoga, CA (US)

(73) Assignee: Force-MOS Technology Corp. (KY)

( * ) Notice: Subject to any disclaimer, the term of this patent is extended or adjusted under 35 U.S.C. 154(b) by 246 days.

(21) Appl. No.: 11/633,366

(22) Filed: Dec. 4, 2006

(65) Prior Publication Data

US 2008/0128829 A1 Jun. 5, 2008

(51) Int. Cl.
*H01L 27/088* (2006.01)
*H01L 21/77* (2006.01)

(52) U.S. Cl. .............. 257/401; 257/330; 257/331; 257/372; 257/E29.257; 257/E21.549

(58) Field of Classification Search ............ 257/331, 257/797, 334, 330, 372, E27.063, 27.063; 438/259

See application file for complete search history.

(56) References Cited

U.S. PATENT DOCUMENTS

| | | | | |
|---|---|---|---|---|
| 6,031,265 A | * | 2/2000 | Hshieh | 257/334 |
| 6,107,661 A | * | 8/2000 | Okabe et al. | 257/330 |
| 6,288,454 B1 | * | 9/2001 | Allman et al. | 257/797 |
| 6,320,223 B1 | * | 11/2001 | Hueting et al. | 257/341 |
| 6,541,818 B2 | * | 4/2003 | Pfirsch et al. | 257/331 |
| 6,621,107 B2 | * | 9/2003 | Blanchard et al. | 257/155 |
| 6,867,083 B2 | * | 3/2005 | Imam et al. | 438/212 |
| 6,936,890 B2 | * | 8/2005 | Hueting et al. | 257/330 |
| 6,949,432 B2 | * | 9/2005 | Blanchard | 438/259 |
| 7,439,583 B2 | * | 10/2008 | Hshieh | 257/341 |
| 2001/0031551 A1 | * | 10/2001 | Hshieh et al. | 438/637 |
| 2006/0202264 A1 | * | 9/2006 | Bhalla et al. | 257/330 |

* cited by examiner

*Primary Examiner*—Leonardo Andújar
*Assistant Examiner*—Teresa M Arroyo
(74) *Attorney, Agent, or Firm*—Bo-In Lin

(57) ABSTRACT

A trenched semiconductor power device that includes a trenched gate disposed in an extended continuous trench surrounding a plurality of transistor cells wherein the layout of the trenched gate surrounding the transistor cells as closed cells having truncated corners or rounded corners. In an exemplary embodiment, the closed cells further includes a contact metal to contact a source and a body regions wherein the contact metal the trenched gate surrounding the transistor cell have a uniform space between them. In another exemplary embodiment, the semiconductor power device further includes a contact dopant region disposed below the contact metal to enhance an electrical contact between the metal contact and the source region and the body region, and the contact dopant region having substantially circular shape to achieve a uniform space between the contact dopant region and the trenched gate surrounding the closed cells.

6 Claims, 8 Drawing Sheets

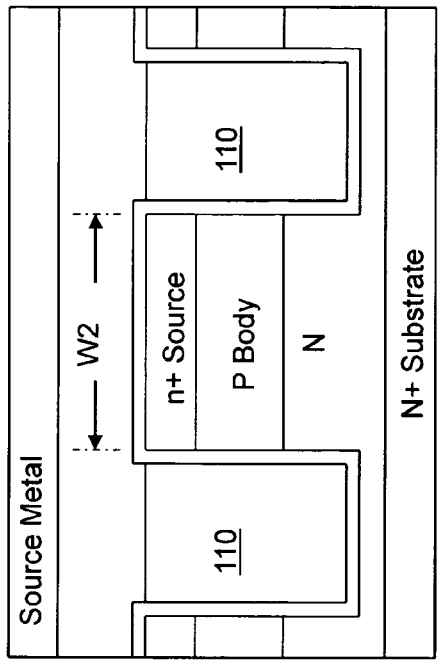
Fig. 2B (B-B' Cross Section)
1) W1 > W2 > W3
2) A (Distance between Contact and Gate Oxide) ≥ Root Square of [(Trench CD Variation)² + (Contact CD Variation)² + (Misalignment between Contact and Trench)² ] > 0
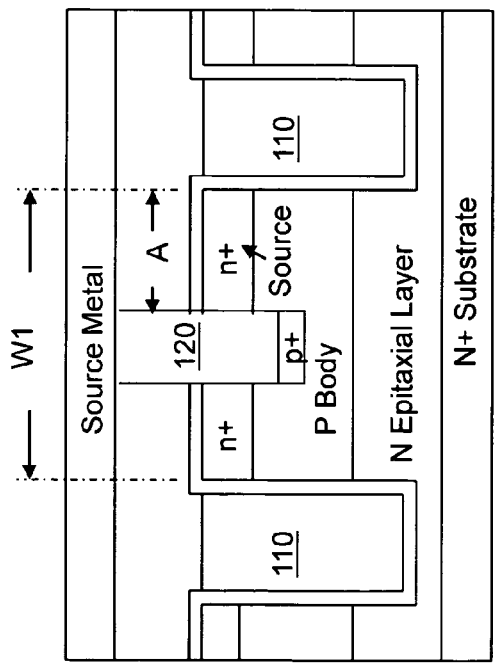
Fig. 2A (A-A' Cross Section)
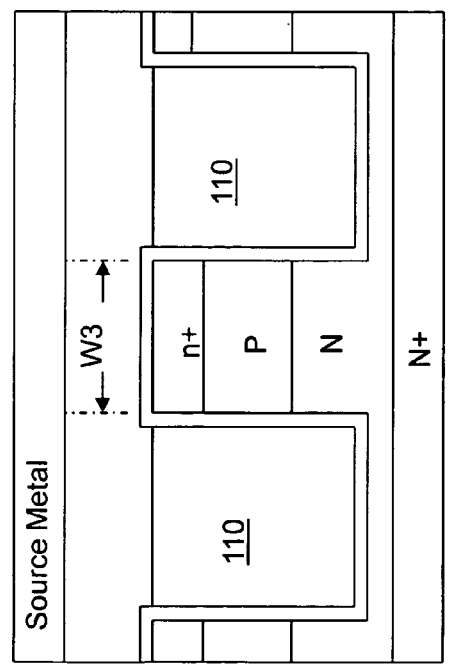
Fig. 2C (C-C' Cross Section)

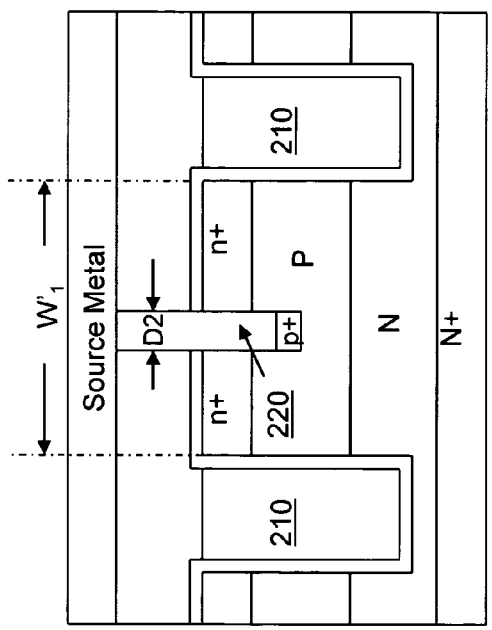
Fig. 3A (D-D' Cross Section)
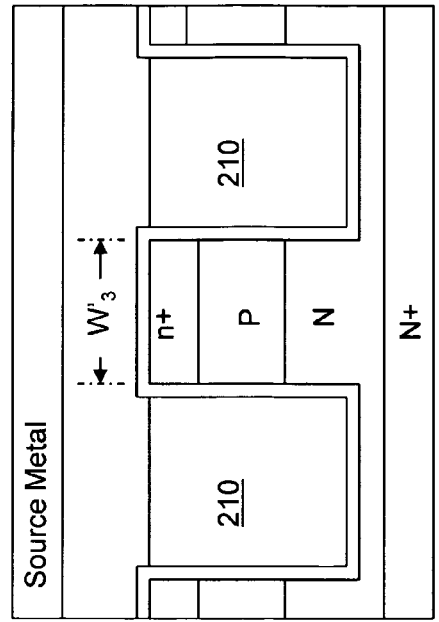
Fig. 3B (E-E' Cross Section)
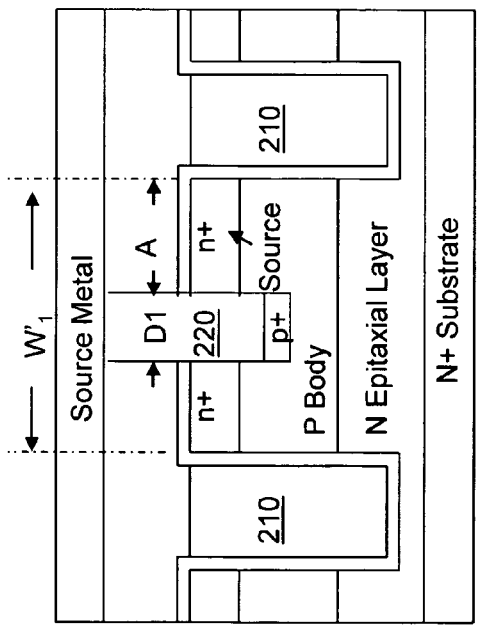
Fig. 3C (F-F' Cross Section)
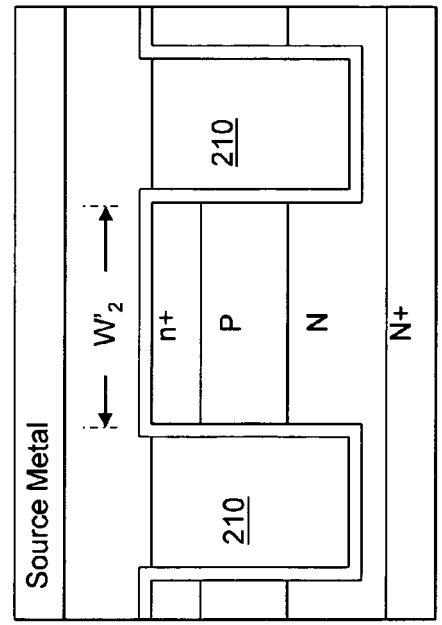
Fig. 3D (G-G' Cross Section)

TRENCH MOSFET WITH CELL LAYOUT, RUGGEDNESS, TRUNCATED CORNERS

BACKGROUND OF THE INVENTION

1. Field of the Invention

This invention relates generally to the cell structure, device configuration and fabrication process of power semiconductor devices. More particularly, this invention relates to a novel and improved cell structure, device configuration and improved process for fabricating a trenched semiconductor power device with improved ruggedness with truncated corners.

2. Description of the Related Art

Configuration of conventional semiconductor power device, particularly those of trenched semiconductor power devices, is still confronted with a technical difficult of parasitic bipolar NPN latch up. The parasitic bipolar NPN latch-up difficulties are specially pronounced near the trench corners. Referring to FIG. 1A for a top view of a closed cell unit and FIGS. 1B and 1C for two different side cross sectional views to show the relative position arrangement of a metal source/body contact 15 from the trenched gate 20. FIG. 1B shows a cross section view of a MOSFET device with planar two-dimensional source/body metal contacts to n+ and p+ horizontally and FIG. 1C shows a cross section view of a MOSFET device with trenched three-dimensional source/body metal contacts to n+ vertically and P+ horizontally. As illustrated in the top view of FIG. 1A both of the cells of FIGS. 1B and 1C have a square cell configuration and the shortest distance between the peripheral sides of the metal contact 15 to the trenched gates is longer from the corner of the metal contact 15 to the corner of the trenched gates. Specifically, the shortest distance between the peripheral sides of the contact metal 15 to four sides of the trenched gate is "A". In contrast, the shortest distance between the metal-contact 15 to the corners of the trenched gates is "B" where:

$$B = 1.414A \quad (1)$$

Referring to FIG. 1D for a cross sectional view for showing an implanting step to form the metal contact dopant P+ region 25. The resistance R between the channel and the P+ region 25 is proportional to the space, i.e., the shortest distance between the metal contact region 15 and the trenched gates 20. Therefore, the space between the metal contact 15 and the trenched gates 20 as represented by the distances A and B, plays an important role in determining the device ruggedness. For this reasons, there are weak points of the MOSFET device due the non-uniform space between the square contact and the trench in the closed cell. These weak points occur at the four corners that result in low avalanche current and reduced device ruggedness due to the parasitic N+PN latches up near the trench corners when I*R>0.7 volts. When bias between Base P(Pwell) and emitter N+(n+ source) of the parasitic N+PN is larger than 0.7 volts, P/N+ diode will be turned on, and thus automatically trigger turn-on of the parasitic N+PN bipolar.

Therefore, there is still a need in the art of the semiconductor device fabrication, particularly for trenched power MOSFET design and fabrication, to provide a novel cell structure, device configuration and fabrication process that would resolve these difficulties and design limitations.

SUMMARY OF THE PRESENT INVENTION

It is therefore an aspect of the present invention to provide new and improved semiconductor power device configuration, such as a MOSFET device with a close cell unit configuration with the surrounding gate arranged with truncated corner or rounded corner layout. The purpose of the truncated corners or the rounded corners of the gate trenches is to make the space between the trenched gate and the metal contact more uniform in the closed cell to enhance the device ruggedness. The above-discussed problems as that encountered in the conventional device configuration are therefore resolved.

Another aspect of the present invention to provide new and improved manufacturing process to manufacture a semiconductor power device with improved closed cell configuration wherein the surrounding gate is arranged with truncated corner layout. The manufacturing process includes a step of "exposure through the mask such that the square contact becomes approximately circular shaped contact and truncated corners become smoother. The truncated corners are formed by design layout not process. It is by nature that truncated corners in layout becomes rounded after exposure due to resolution issue of 0.18~0.35 μm photolithography. The spaces between the trenched gate and the metal contact are therefore more uniform in the closed cell to enhance the device ruggedness.

Another aspect of the present invention to provide new and improved closed cell configuration of a semiconductor power device with a design rule that the greatest difference between the longest distance and the shortest distance between the source/body contact and the trenched gate is significantly less than a predefined value to achieve an improved device ruggedness. In an exemplary embodiment, the ratio of the longest distance to the shortest distance is less than 1.414 to achieve an improved device-ruggedness over the conventional squared-shaped closed cell layout.

Briefly, in a preferred embodiment, the present invention discloses a trenched semiconductor power device that includes a trenched gate disposed in an extended continuous trench surrounding a plurality of transistor cells in an active cell area wherein the layout of the trenched gate surrounding the transistor cells as closed cells having truncated corners. In an exemplary embodiment, the closed cells further includes a contact metal to contact a source and a body regions wherein the contact metal the trenched gate surrounding the transistor cell have a uniform space between them. In another exemplary embodiment, the semiconductor power device further includes a contact dopant region disposed below the contact metal to enhance an electrical contact between the metal contact and the source region and the body region, and the contact dopant region having substantially circular shape to achieve a uniform space between the contact dopant region and the trenched gate surrounding the closed cells.

Furthermore, in an exemplary embodiment, this invention discloses a manufacturing process for manufacturing a trenched semiconductor power device that includes a trenched gate disposed in an extended continuous trench surrounding a plurality of transistor cells wherein the layout of the trenched gate surrounding the transistor cells as closed cells. The method includes a step of doping a source/body metal contact region in an area surrounded by said trenched gate at a location and shape such that there is substantially a uniform space between the doped metal contact region and the surrounding trenched gate. In an exemplary embodiment, the method further includes a step of doping the metal contact region having substantially a circular shape such that there is a substantially a uniform space between the doped metal contact region and the surrounding trenched gate. In another exemplary embodiment, the method further includes a step of fabricating the trenches with truncated corners surround the doped contact region whereby there is a uniform space between the doped contact region and the surrounding trenched gate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
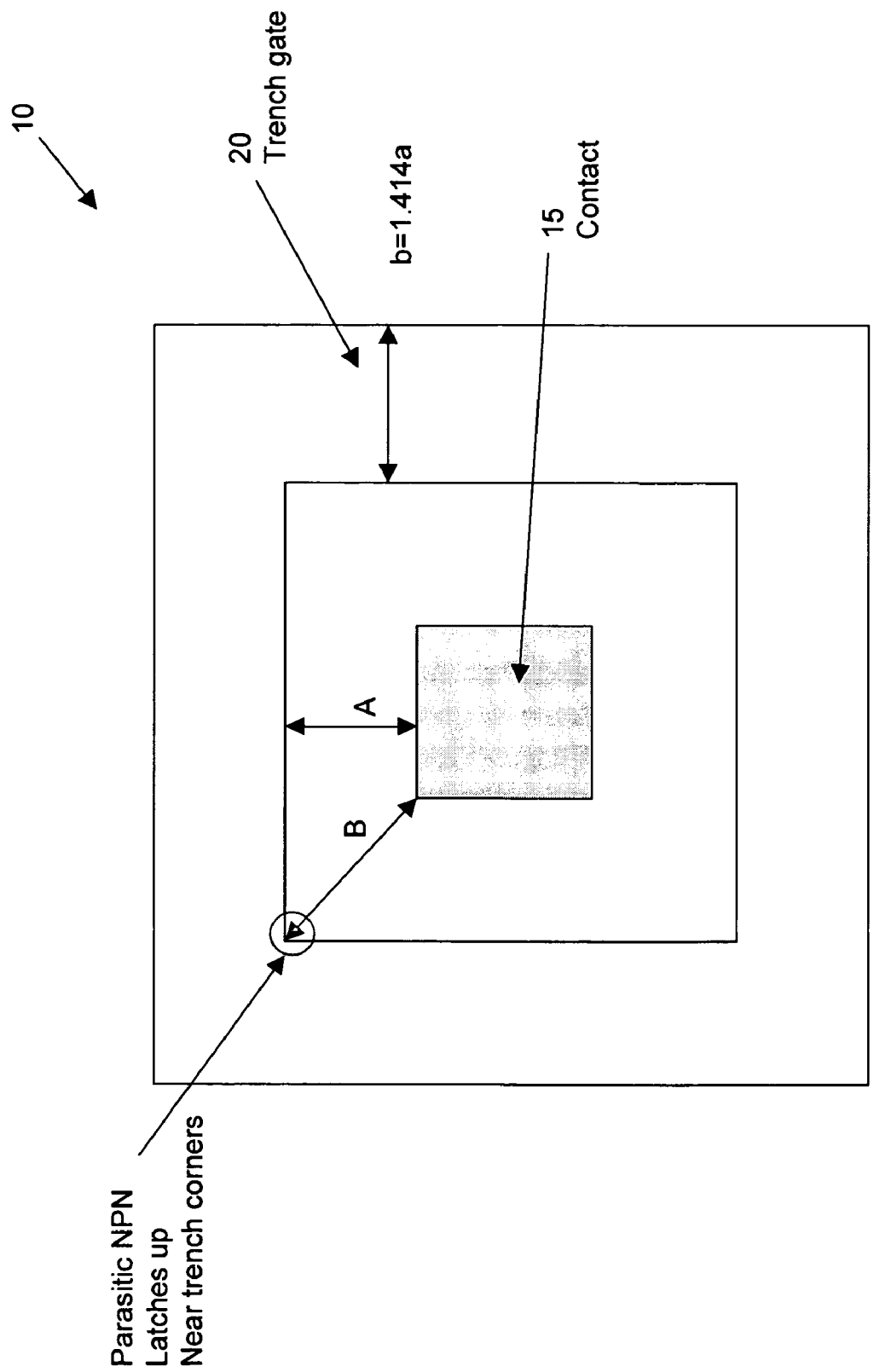
FIG. 1A is a top view and FIGS. 1B to 1D are cross sectional views for illustrating a configuration cell layout of a closed cell unit of a MOSFET device with non-uniform space between the metal contact the trenched gates surrounding the closed unit cells.
Figure 1B:
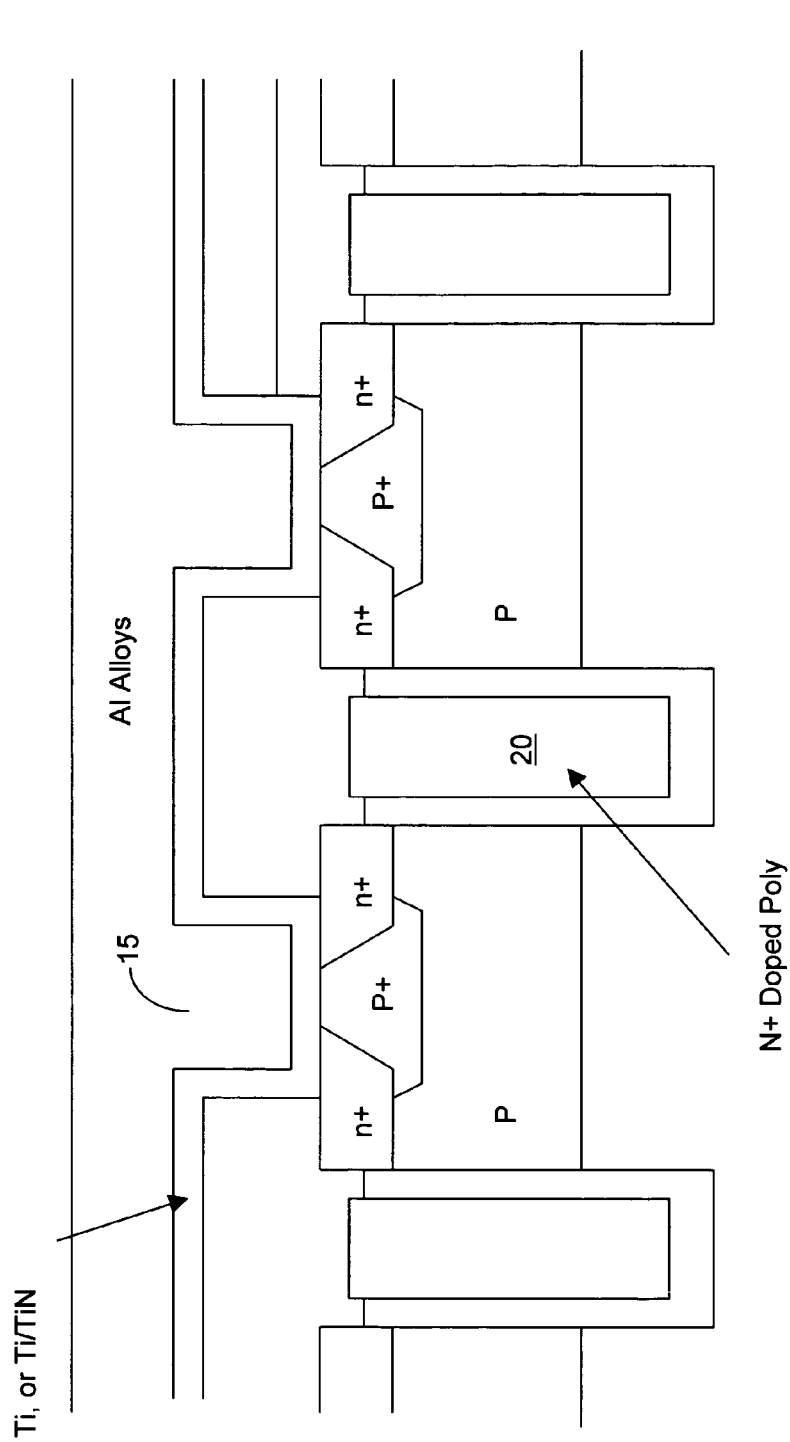
Figure 1C:
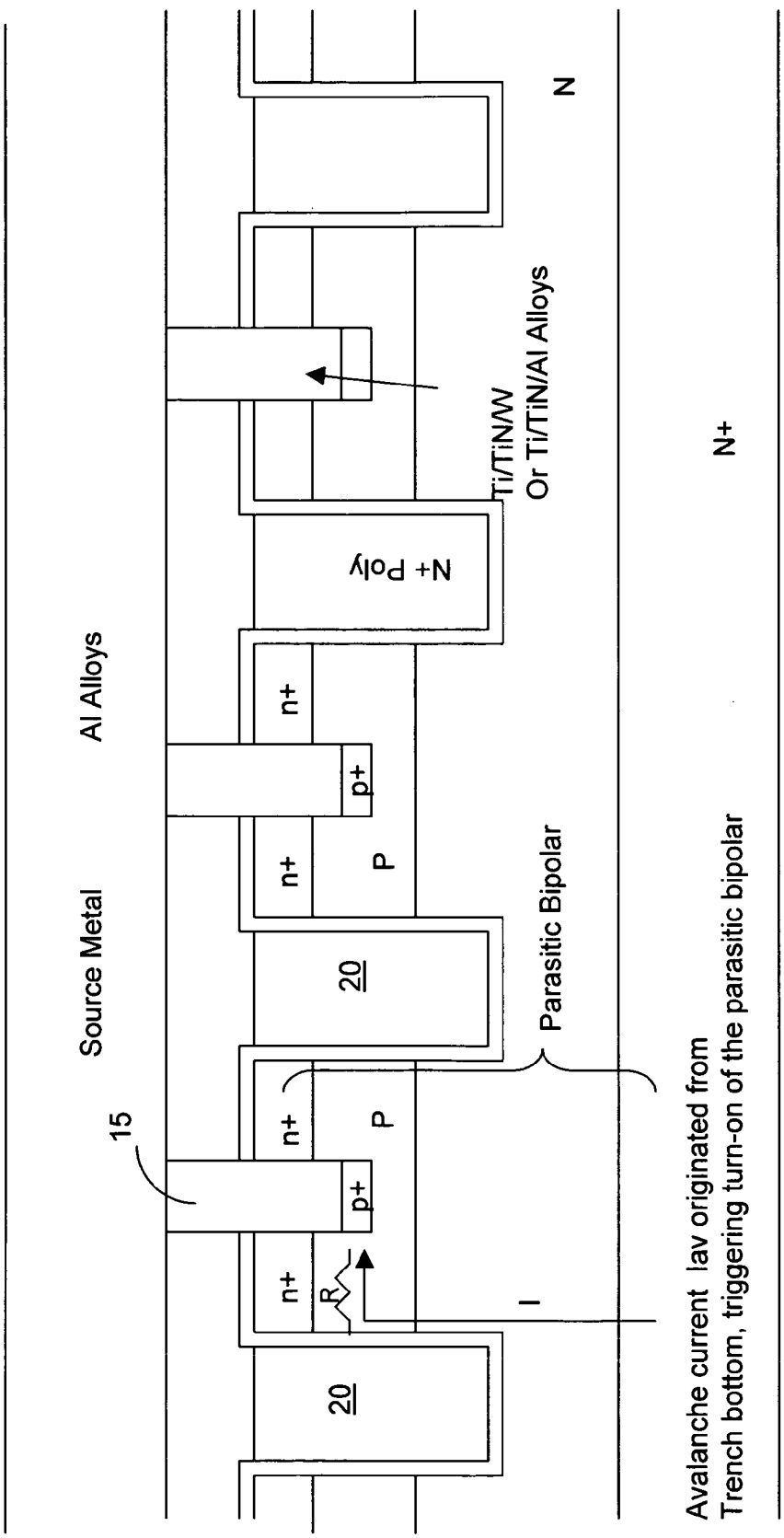
Figure 1D:
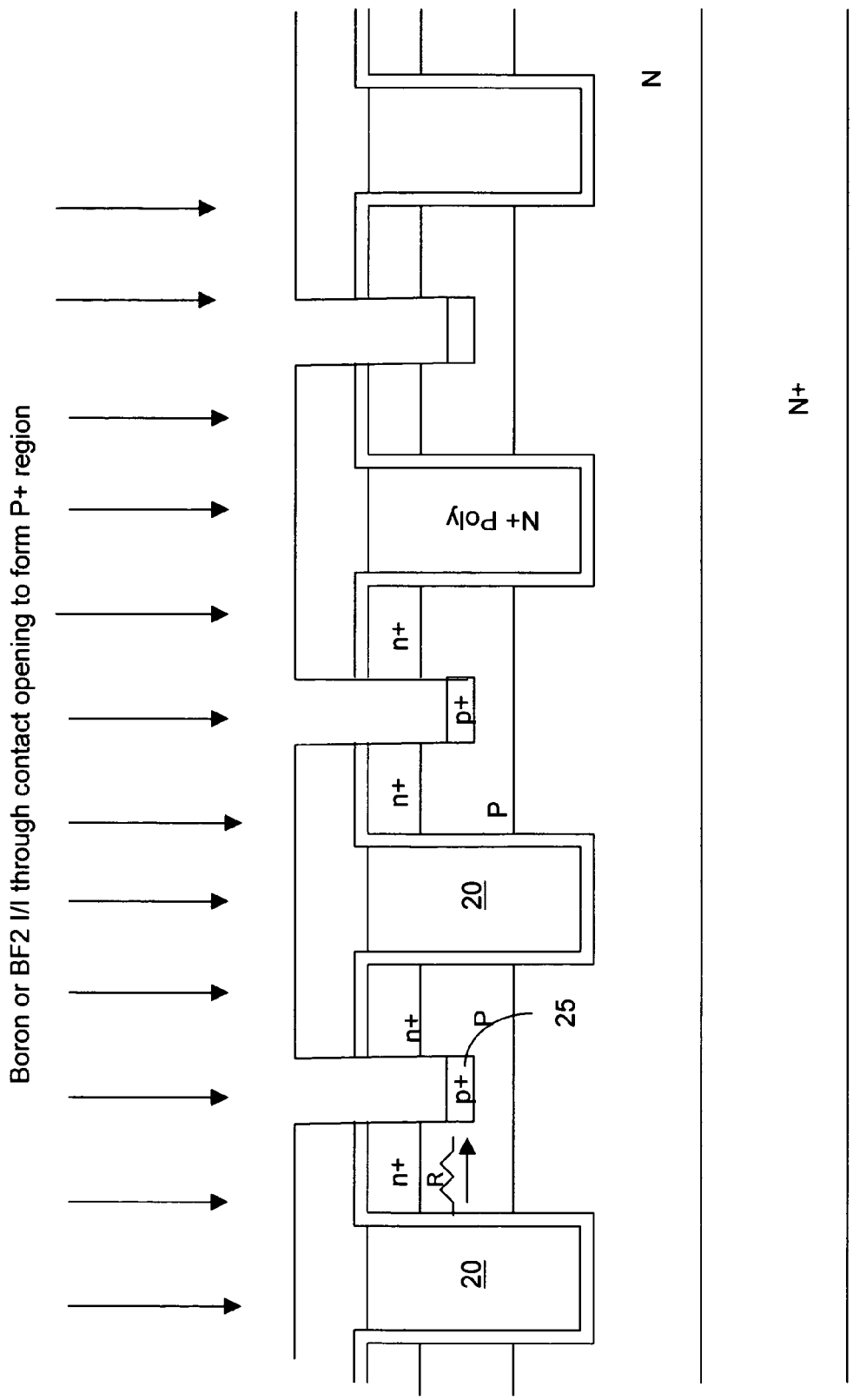
Figure 2:
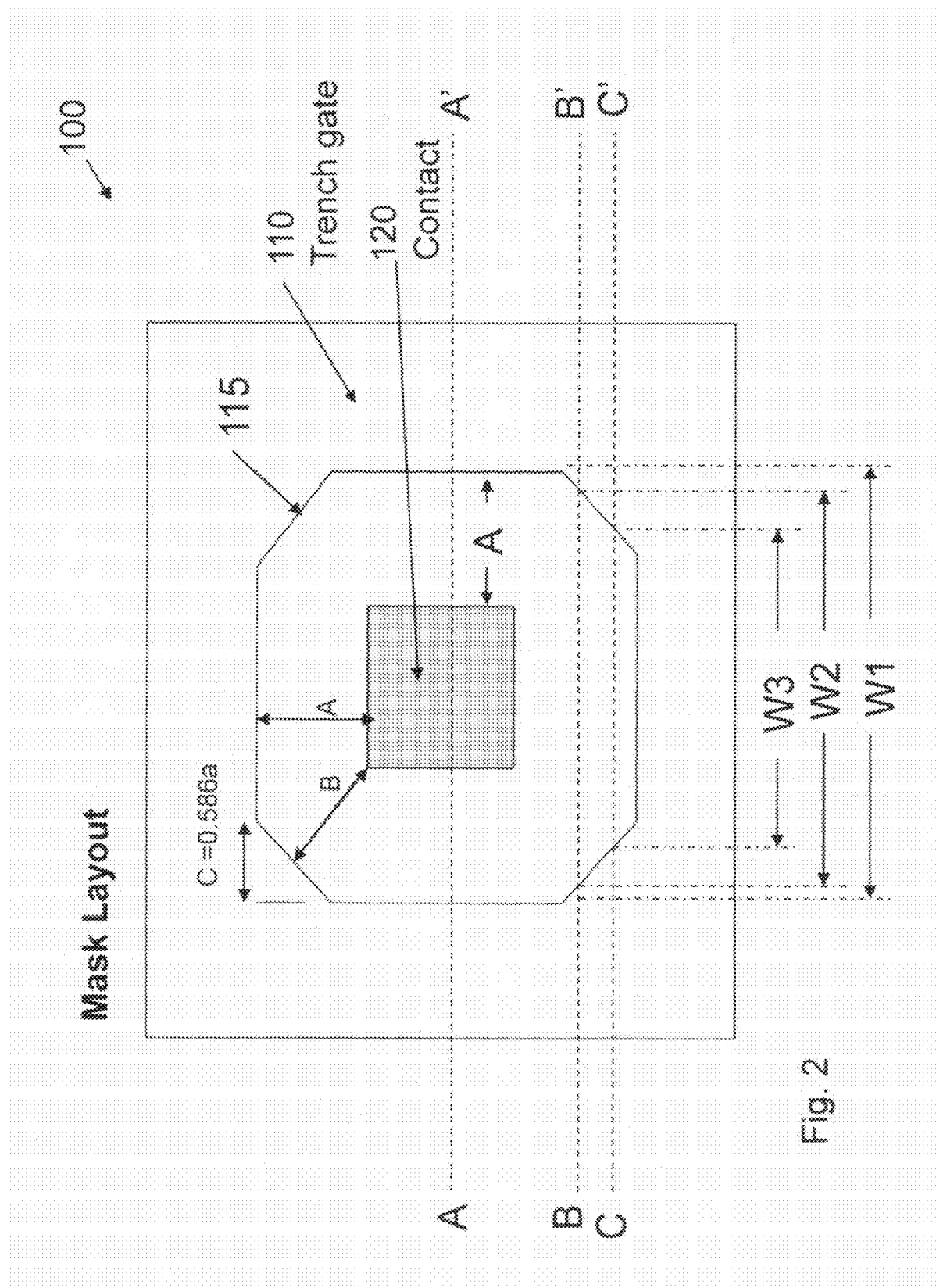
FIG. 2 is an improved cell layout a closed unit cell for a MOSFET device of this invention to achieve uniform space between the metal contact and the trenched gates surrounding the closed cell unit to enhance the device ruggedness.

Please refer to FIG. 2 for a top view of a closed cell configuration of an improved semiconductor power device 100 of this invention. The closed cell is surrounded by a trenched gate 110 that has a truncated corners 115 such that the distance B between the truncated corners to the metal contact or a doped contact region 120 is substantially equal to the distance A between the edges of the contact region 120 to the edges of the trenched gate, i.e., B=A. There is a uniform space between the surrounding trenched gate 110 and the metal contact or doped contact region 120. The weak spots around the corners in a conventional layout are therefore eliminated. FIGS. 2A, 2B and 2C show three cross sectional views of the close semiconductor power cell along lines A-A', B-B' and C-C' as that shown in FIG. 2. The close semiconductor cell is surrounded by trench gates with a body region formed between the trench gates and encompassing a source region. The closed semiconductor power cell is supported on an epitaxial layer formed on top of a semiconductor substrate with the conductivity types shown for each region. The closed semiconductor power cell further includes a trench source-body trench contact 120 extended into the body region through the source region of the closed semiconductor power cell in contact with a p+ contact dopant region disposed immediately below the trench contact 120. These three cross sectional view clearly show that the distances between the inner sidewalls of the trench gates surrounding the closed semiconductor power cell is decreased from W1 to W2 and then to W3, i.e., W1>W2>W3, to form the truncated corners for the trench gates surrounding the closed semiconductor power cell. As shown in the FIGS. 2 and 2A to 2C, the trench source-body trench contact 120 is disposed substantially equal distance, i.e., A=B, from the inside walls of the trench gates 110. For practical concerns of manufacturing misalignment tolerances and CD (Critical Dimension) variation of trench and contact, the distance A or B can be expressed as equal to or larger than:

Root Square of[(Trench CD Variation)$^2$+(Contact CD Variation)$^2$+(Misalignment between Contact and Trench)$^2$]>0

Figure 3:
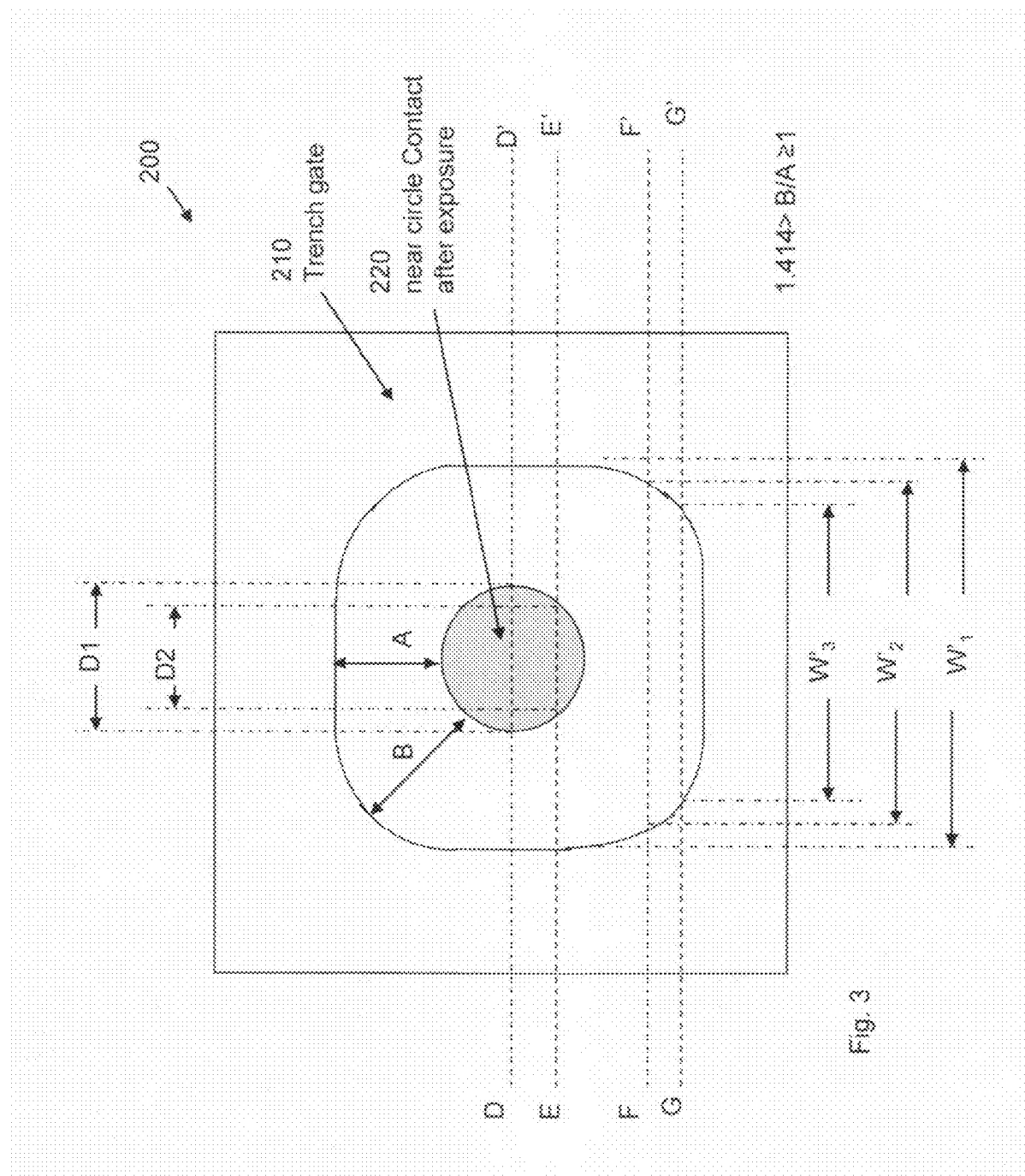
FIG. 3 is another improved cell layout a closed unit cell for a MOSFET device of this invention with substantially circular contact dopant regions to achieve improved uniformity of space between the metal contact and the trenched gates surrounding the closed cell unit to enhance the device ruggedness.

Referring to FIG. 3 for another embodiment of this invention wherein a closed cell unit 200 of a MOSFET device includes trenched gate 210 surrounding a metal contact disposed above a doped contact region 220. The doped contact region 220 is formed with substantial circular shape and the trenched gate is formed with rounded corners 215. The distance from the edge of the circular doped contact region 220 to the trenched gate 200 including the distance B to the rounded corners 215 and to the distance A to the edges of the trenched gate are substantially the same, i.e., B=A. Therefore, the ratio of B/A is substantially kept near 1.0 and certainly smaller than 1.414. The weak spots near the corners of the trenched gate that caused reduced device ruggedness are therefore eliminated. FIGS. 3A, 3B, 3C and 3D show three cross sectional views of the close semiconductor power cell along lines D-D', E-E', F-F' and G-G' respectively as that shown in FIG. 3. The close semiconductor cell is surrounded by trench gates with a body region formed between the trench gates and encompassing a source region. The closed semiconductor power cell is supported on an epitaxial layer formed on top of a semiconductor substrate with the conductivity types shown for each region. The closed semiconductor power cell further includes a circular trench source-body trench contact 220 extended into the body region through the source region of the closed semiconductor power cell in contact with a p+ contact dopant region disposed immediately below the trench contact 120. The circular trench contact 220 is disposed at a distance away from a gate oxide lining of said trench gate from all circumferential points of the circular trench contact. These four cross sectional views clearly show that the distances between the inner sidewalls of the trench gates surrounding the closed semiconductor power cell is decreased from W'1 to W'2 and then to W'3, i.e., W'1>W'2>W'3, to form the truncated corners for the trench gates surrounding the closed semiconductor power cell with a circular trench source-body contact 220. Furthermore, FIGS. 3 and 3A and 3B show D1>D2 for a circuit trench source-body contact. As shown in the FIGS. 3 and 3A to 3D, the trench source-body trench contact 220 is disposed substantially at distances A and B, from the inside walls of the trench gates 210 wherein A is substantially equal to B, i.e., A=B, or B is less than 1.414A, i.e., B<1.414A. For practical concern of manufacturing misalignment tolerances and CD (Critical Dimension) variation of trench and contact, the distance A or B can be expressed as equal to or larger than:

Root Square of[(Trench CD Variation)$^2$+(Contact CD Variation)$^2$+(Misalignment between Contact and Trench)$^2$]>0

The process for manufacturing the semiconductor power device as disclosed above thus includes a step of "exposure through the mask" such that the square contact becomes approximately circular shaped contact and truncated corners become smoother. The truncated corners are formed by design layout not process. It is by nature that truncated corners in layout as that shown in FIG. 2 and becomes rounded as shown in FIG. 3. Such configuration is formed after exposure because of the photolithography resolution of 0.18~0.35 micrometers. A MOSFET device shown in FIG. 3 is another embodiment that can be produced by applying a design layout that implemented as on of the manufacturing processes.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A trenched semiconductor power device comprising a plurality of trenched gates surrounding a plurality of transistor cells formed in a semiconductor substrate, wherein:
    said trenched gates surrounding said transistor cells as closed cells constituting substantially square-shaped cells with rounded corners;
    each of said closed cells further includes a circular trench contact disposed substantially in a central portion of said closed cells, penetrating through a source region surrounding said trenched gates and extending into a body region encompassing said source region;
    said circular trench contact comprises a hole opened from a top surface of said semiconductor substrate and is filled with a contact metal plug wherein sidewalls of said hole are surrounded by and in contact said source and body regions and said circular trench contact is separate from said trenched gates with said source region and body region disposed between a gate oxide lining of said trenched gates and all circumferential points of the circular trench contact; and
    said contact metal plug connected to a source metal disposed on top of said circular trench contact.

2. The trenched semiconductor power device of claim 1 further comprising:
    a contact resistance reduction metal layer composed of a titanium (Ti) layer disposed above a top surface said contact metal plug and below a bottom surface of said source metal for reducing a contact resistance between said contact metal plug and said source metal.

3. The trenched semiconductor power device of claim 1 wherein:
    said contact metal plug disposed in said hole of said circular trench contact further comprising a Ti/TiN/W metal plug.

4. The trenched semiconductor power device of claim 1 wherein:
    said source metal disposed on top of and in contact with a top surface of said metal plug further comprising a layer composed of aluminum alloys including alloys of AlCu or AlSiCu.

5. The trenched semiconductor power device of claim 1 wherein:
    a diameter of a top surface of said circular trench contact is smaller than 1.0 micrometer.

6. A trenched semiconductor power device comprising a plurality of trenched gates surrounding a plurality of transistor cells formed in a semiconductor substrate, wherein:
    said trenched gates surrounding said transistor cells as closed cells constituting substantially square-shaped cells with truncated corners;
    each of said closed cells further includes a circular trench contact hole disposed substantially in a central portion of said closed cells with a diameter of a top surface of said circuit trench contact less than 1.0 micrometer, penetrating through source regions surrounding said trenched gates and extending into body regions encompassing said source regions;
    said circular trench contact comprises a hole opened from a top surface of said semiconductor substrate wherein sidewalls of said hole are surrounded by and in contact with said source and body regions and said circular trench contact and is separate from said trenched gates with said source region and body region disposed between a gate oxide lining of said trenched gate and all circumferential points of the circular trench contact; and
    said circular trench contact hole is filled with a metal plug composed of a Ti/TiN/W plug to contact said source and body regions and said metal plug contacting a source metal disposed on top of said metal plug wherein said source metal layer composed of Ti/AlCu or Ti/AlSiCu alloys.

* * * * *